(12) United States Patent
Lee et al.

(10) Patent No.: US 6,819,969 B2
(45) Date of Patent: Nov. 16, 2004

(54) CHEMICAL VAPOR DEPOSITION PROCESS AND APPARATUS FOR PERFORMING THE SAME

(75) Inventors: Hee-Tae Lee, Gyeonggi-do (KR); Yoon-Sei Park, Gyeonggi-do (KR); Kwang-Sig Kim, Gyeonggi-do (KR); Jong-Woo Kim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 390 days.

(21) Appl. No.: 09/963,482

(22) Filed: Sep. 27, 2001

(65) Prior Publication Data

US 2002/0045966 A1 Apr. 18, 2002

(30) Foreign Application Priority Data

Oct. 18, 2000 (KR) ........................................ 2000-61264

(51) Int. Cl.[7] .............................................. G06F 19/00
(52) U.S. Cl. ...................... 700/121; 137/457; 134/22.1
(58) Field of Search ...................... 700/121; 137/457; 134/22.1

(56) References Cited

U.S. PATENT DOCUMENTS

| 4,657,616 | A | | 4/1987 | Benzing et al. | |
|---|---|---|---|---|---|
| 5,063,783 | A | * | 11/1991 | Zajac | ........................... 73/714 |
| 5,275,976 | A | * | 1/1994 | Moslehi | ....................... 438/800 |
| 5,380,370 | A | * | 1/1995 | Niino et al. | .............. 134/22.11 |
| 5,454,903 | A | | 10/1995 | Redeker et al. | |
| 5,812,403 | A | | 9/1998 | Fong et al. | |
| 5,902,403 | A | * | 5/1999 | Aitani et al. | ................. 118/715 |
| 5,988,187 | A | * | 11/1999 | Trussell et al. | ............. 134/22.1 |
| 6,068,703 | A | * | 5/2000 | Chen et al. | ................... 118/715 |
| 6,155,289 | A | * | 12/2000 | Carlsen et al. | ............... 137/457 |

FOREIGN PATENT DOCUMENTS

| JP | 1995-094487 | * | 9/1993 | ........... H01L/21/31 |
|---|---|---|---|---|
| JP | 1995-094487 | A | 4/1995 | |
| JP | 1997-246260 | * | 3/1996 | ........... H01L/21/31 |
| JP | 1997-246260 | A | 9/1997 | |

\* cited by examiner

*Primary Examiner*—Leo Picard
*Assistant Examiner*—Michael D. Masinick
(74) *Attorney, Agent, or Firm*—Volentine Francos & Whitt, PLLC

(57) ABSTRACT

An apparatus and a method for performing a chemical vapor deposition process that reduces particle contamination of a wafer, wherein a cleaning gas including a fluorine radical is introduced into the process chamber to clean the chamber. After loading a wafer in the process chamber, a deposition gas is introduced into the chamber to form a film on the wafer. An inert gas as a back flow-preventing gas is introduced into the process chamber through a cleaning gas supply line to prevent the deposition gas from flowing back toward the cleaning gas supply line. Thus, the cleaning gas supply line is prevented from being contaminated by the deposition gas and particle formation on the wafer during deposition of the film is reduced, so that yield and reliability of the semiconductor device may be improved.

11 Claims, 6 Drawing Sheets

CHEMICAL VAPOR DEPOSITION PROCESS AND APPARATUS FOR PERFORMING THE SAME

The present application claims priority under 35 U.S.C. §119 to Korean Application No. 2000-61264, which is hereby incorporated by reference in its entirety for all purposes.

BACKGROUND OF THE INVENTION

1. Field of the Invention

The present invention relates to a method and an apparatus for manufacturing a semiconductor device, and more particularly to a method of performing a chemical vapor deposition process in such a manner that particles can be prevented from forming on a wafer, and an apparatus for performing the same.

2. Description of the Related Art

Recently, as information media including computers are becoming more widely used, the semiconductor industry has made great strides. From a functional standpoint, a semiconductor device is required to be operated at a high speed and to have large storage capacitance. Accordingly, semiconductor manufacturing techniques are developing to improve integration degree, reliance and response speed of semiconductor devices. Thus, strict requirements are required during performing of semiconductor manufacturing processes, such as chemical vapor deposition, which forms a film on a wafer.

Generally, when a chemical vapor deposition process is carried out, deposition gases (source gas) are introduced into a chamber in which the wafer is placed, and the deposition gases react with each other in the chamber so that a film is deposited on the wafer. However, a part of the deposition gases, which is not reacted during the chemical vapor deposition process, is deposited on sidewalls of the chamber or floats in the chamber after the chemical vapor deposition process has been finished. The deposition gases floating in the chamber or deposited on the sidewalls of the chamber cause the generation of particles. The particles can be dropped onto a wafer newly introduced into the chamber, thereby resulting in ultimate failure of the wafer. For this reason, a cleaning process is carried out in the chamber before a wafer is newly introduced into the chamber.

The cleaning of the chamber is carried out by introducing a cleaning gas capable of etching the particles in the chamber. That is, after introducing the cleaning gas into the chamber, a plasma is formed in the chamber in-situ. Then, after etching the particles by using the cleaning gas, the particles are exhausted from the chamber.

There are known methods for cleaning a chamber by forming plasma in-situ. However, when cleaning of the chamber is carried out by forming plasma in-situ, sidewalls of the chamber can be damaged by physical sputtering, so that the chamber is contaminated. For this reason, a known method comprises forming plasma at an exterior of the chamber using a plasma device, and introducing the radical of the cleaning gas into the chamber so as to clean the chamber.

FIG. 1 shows a conventional apparatus for performing a chemical vapor deposition process. Referring to FIG. 1, the apparatus has a chamber 10 in which the chemical vapor deposition process is carried out. A heater (heating plate) 12 on which a wafer W is placed is installed at an inner lower portion of the chamber 10. A shower 14 for introducing a deposition gas and a cleaning gas into the chamber 10 is provided at an inner upper portion of the chamber 10. A deposition gas supply section 20 is installed at an exterior of the chamber 10 in order to supply the deposition gas into the chamber 10. Since the deposition gas is made by mixing various kinds of gases, the deposition gas supply section 20 includes a plurality of gas supply parts 20a, 20b and 20c corresponding to the kinds of the gases. A gas mixer 16 is connected to the deposition gas supply section 20 so as to mix the gases. The gas mixer 16 is also connected to the chamber 10. Accordingly, the gas supply parts 20a, 20b and 20c supply the gases into the gas mixer 16 via respective valves 22a, 22b and 22c and through a deposition gas supply line 18. Then, the gases are mixed in the gas mixer 16 and introduced into the chamber 10.

In addition, a cleaning gas supply section 28 is provided to supply the cleaning gas into the chamber 10. Since the cleaning gas can be made by mixing various kinds of gases, the cleaning gas supply section 28 includes a plurality of cleaning gas supply parts 28a and 28b corresponding to the kinds of the gases. The cleaning gas supply parts 28a and 28b are connected to a plasma device 26 via respective valves 30a and 30b, and through a cleaning gas supply line 24, so that the cleaning gas supplied from the cleaning gas supply parts 28a and 28b is excited in the plasma device 26. The plasma device 26 is connected to the gas mixer 16, so that the cleaning gas filtered in the plasma device 26 is introduced into the chamber 10 through the gas mixer 16, thereby cleaning the chamber 10.

In order to deposit a film on a wafer by using the chemical vapor deposition apparatus of FIG. 1, the chamber 10 is firstly cleaned before the wafer W is loaded into the chamber 10. The cleaning of the chamber 10 is carried out by introducing the cleaning gas into the chamber 10. The particles deposited on the sidewalls of the chamber 10 and the gas floating in the chamber 10 are etched by the cleaning gas introduced into the chamber 10, and are exhausted out of the chamber 10. After cleaning the chamber 10, the wafer W is loaded in the chamber 10. Then, the deposition gas is introduced into the chamber 10 through the deposition gas supply parts 20a, 20b and 20c, so as to deposit the film on the wafer W.

However, while the deposition process is being carried out, a part of the deposition gas supplied from the deposition gas supply parts 20a, 20b and 20c flows back toward the cleaning gas supply line 24. Since a part of the cleaning gas, which is supplied when the cleaning process is carried out, remains in the cleaning gas supply line 24, the part of the deposition gas which has flowed back reacts with the remaining part of the cleaning gas, so that particles are generated. The particles drop onto the wafer while the deposition process is being carried out, thereby resulting in the ultimate failure of the wafer. In addition, the deposition gas which has flowed back is deposited on the cleaning gas supply line 24, or floats in the cleaning gas supply line 24, to thus contaminate the cleaning gas supply line 24. Accordingly, particles are formed on a wafer which is newly introduced into the chamber for the deposition process.

SUMMARY OF THE INVENTION

The present invention is therefore directed to a chemical vapor deposition process and apparatus for performing the same, which substantially overcome one or more of the problems due to the limitations and disadvantages of the related art.

A first object of the present invention is to provide a chemical vapor deposition process for reducing particles formed on a wafer.

A second object of the present invention is to provide an apparatus for carrying out the chemical vapor deposition process.

To accomplish the first and other objects of the present invention, there is provided a method of performing a chemical vapor deposition process, whereby a process chamber is cleaned by introducing a cleaning gas including a fluorine radical into the process chamber. A wafer is then loaded into the process chamber. A film is deposited on the wafer by introducing a deposition gas into the process chamber, while preventing the deposition gas from flowing back toward a cleaning gas supply line.

To accomplish the second and other objects of the present invention, there is provided an apparatus for carrying out a chemical vapor deposition process, the apparatus having a process chamber in which the chemical vapor deposition process is carried out. A first supplier supplies a cleaning gas into the process chamber for cleaning the process chamber. A plasma device is installed between the process chamber and the first supplier, to excite the cleaning gas supplied from the first supplier. A second supplier supplies a deposition gas into the process chamber, so as to deposit a film on a wafer. A mixer mixes gases supplied from the first and second supplier into the process chamber, and a mechanism is provided to prevent the deposition gas from flowing back toward the first supplier.

In accordance with the above-noted method and apparatus, when the film is being deposited on the wafer, the deposition gas is prevented from flowing into the cleaning gas supply line, so that particles are effectively reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
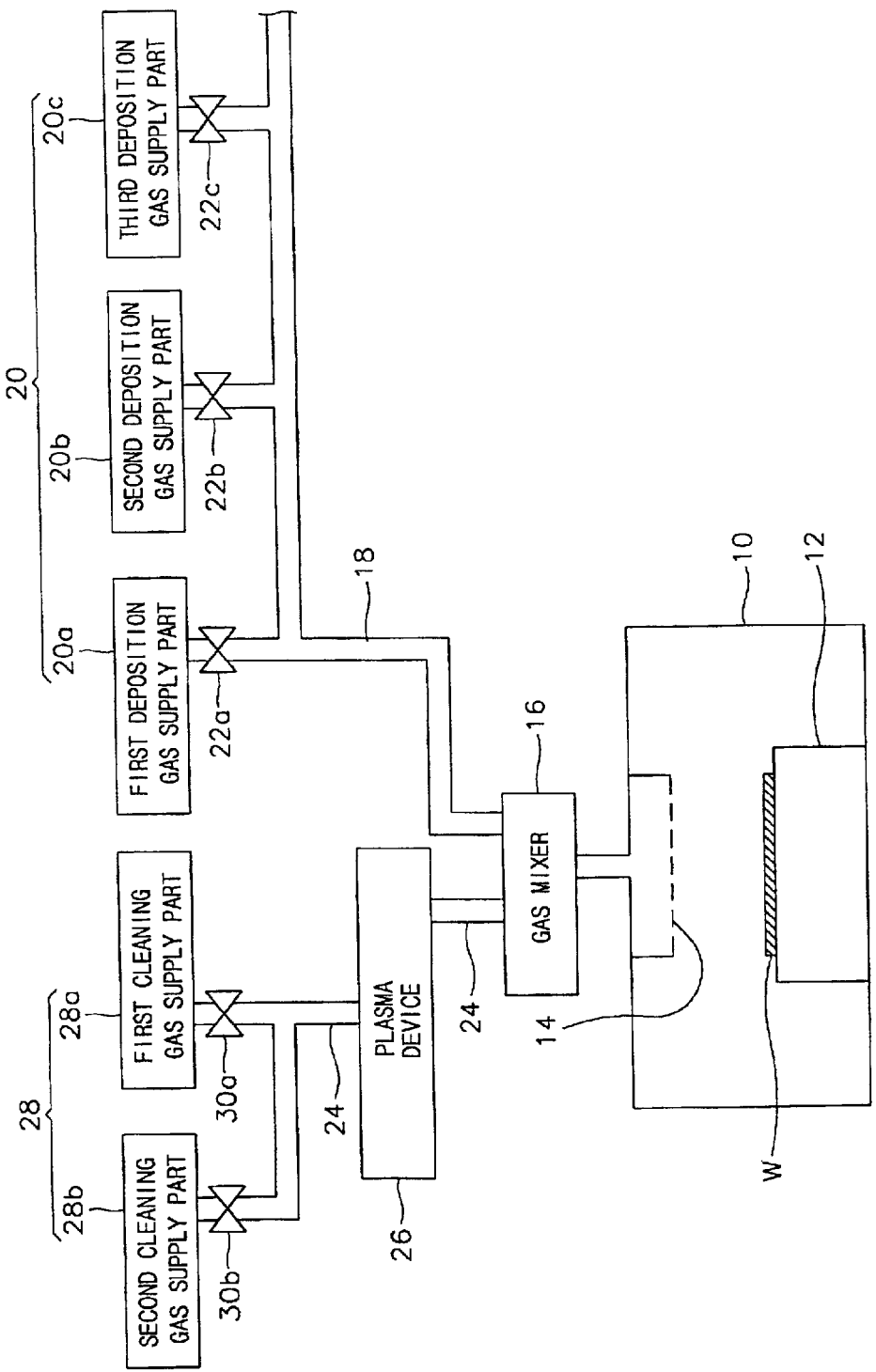
FIG. 1 is a schematic view showing a conventional apparatus for performing a chemical vapor deposition process.
Figure 2:
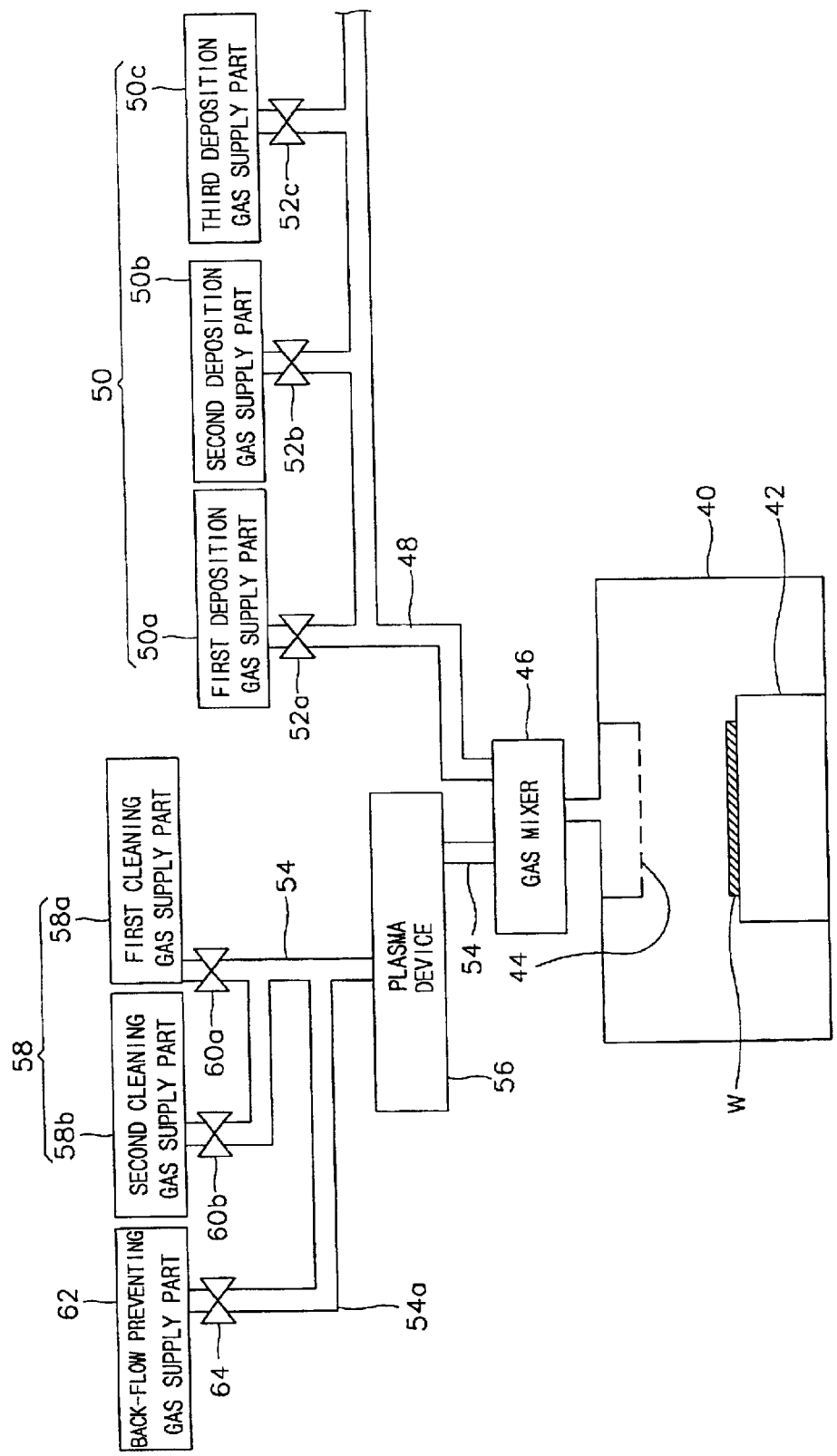
FIG. 2 is a schematic view showing an apparatus for performing a chemical vapor deposition process according to a first embodiment of the present invention.

FIG. 2 shows an apparatus for carrying out a chemical vapor deposition process according to a first embodiment of the present invention. Referring to FIG. 2, the apparatus has a chamber 40 in which chemical vapor deposition on a wafer W is performed. A heater (such as a heating plate) 42, on which the wafer W is placed, is installed at an inner lower portion of the chamber 40. The heater 42 is maintained at a temperature of 400 to 600° C. when the chemical vapor deposition process is being carried out. Since the wafer W is placed on the heater 42 having high temperature, a large amount of deposition gases are reacted to form a deposited film on the wafer W. A shower 44, through which the cleaning gas and deposition gas are introduced into the chamber 40, is provided at an inner upper portion of the chamber 40. The shower 44 includes a plate having a plurality of pores. The deposition gas is vertically supplied onto the wafer W through the pores of the shower 44 so that a film is deposited thereon.

A gas supply section 50 is provided at an exterior of the chamber 40. The gas supply section 50 supplies the deposition gas which is reacted in the chamber 40 to deposit a film on the wafer W and an inert gas for forming the process atmosphere in the chamber. Various kinds of gases can be used as the deposition gas, so that the deposition gas supply section 50 includes a plurality of gas supply parts corresponding to the kinds of the gases. In this embodiment, first to third deposition gas supply parts 50a, 50b and 50c are provided, although the number of deposition gas supply parts should not be limited in number to three. A gas mixer 46 is connected to the deposition gas supply section 50 through a deposition gas supply line 48. In addition, the gas mixer 46 is connected to the chamber 40. Switching valves 52a, 52b and 52c are respectively positioned between the first to third deposition gas supply parts 50a, 50b and 50c and the deposition gas supply line 48, so as to control the flow rate of the deposition gas. Accordingly, the deposition gases supplied from the first to third gas supply parts 50a, 50b and 50c are introduced into the gas mixer 46 through the deposition gas supply line 48. Then, the deposition gases are mixed in the gas mixer 46 and are introduced into the chamber 40.

In addition, a cleaning gas supply section 58 is provided to supply the cleaning gas into the chamber 40. The cleaning gas is made by mixing a gas capable of etching the particles which are attached to sidewalls of the chamber 40 or which float in the chamber 40, with an inert gas (as a carrier gas for carrying the gas) capable of forming a process atmosphere in the chamber 40. Accordingly, since the cleaning gas is made by mixing various kinds of gases, the cleaning gas supply section 58 includes a plurality of cleaning gas supply parts corresponding to the kinds of the gases. In this embodiment, first and second cleaning gas supply parts 58a and 58b are provided. The cleaning gas supply section 58 is connected to a plasma device 56 through a cleaning gas supply line 54, so that the cleaning gases supplied from the cleaning gas supply parts 58a and 58b are excited by the plasma device 56. The plasma device 56 is connected to the gas mixer 46 through the cleaning gas supply line 54.

Switching valves 60a and 60b are respectively positioned between the first and second cleaning gas supply parts 58a and 58b and the cleaning gas supply line 54, so as to control the flow rate of the cleaning gas. Accordingly, the cleaning gases supplied from the first and second cleaning gas supply parts 58a and 58b are filtered by the plasma device 56, and the filtered cleaning gases are introduced into the chamber 40 through the gas mixer 46.

When the chemical vapor deposition process is carried out, the switching valves 60a and 60b connected to the cleaning gas supply section 58 are closed off, so that the cleaning gas is not supplied into the chamber 40. However, since the cleaning gas supply line 54 is opened, a part of the deposition gas flows back toward the cleaning gas supply line 54. If the deposition gas flows back into the cleaning gas supply line 54, the cleaning gas supply line 54 becomes contaminated by the deposition gas, thereby forming particles. The particles can drop onto the wafer W while the deposition process is being carried out, thereby resulting in the ultimate failure of the wafer. Accordingly, a back-flow preventer is provided to prevent the deposition gas from flowing back.

The back-flow preventer includes a branch line 54a which is branched from the cleaning gas supply line 54. The branch line 54a can be positioned at any position in the cleaning gas supply line 54. In the present example, the branch line 54a is positioned at a position of the cleaning gas supply line 54 at which the plasma device 56 and the cleaning gas supply section 58 are connected to each other. In addition, a back-flow preventing gas supply part 62 is provided. The back-flow preventing gas supply part 62 is connected to an end of the branch line 54a and supplies a back-flow preventing gas so as to prevent the deposition gas from flowing back. Here, the back-flow preventing gas is a second inert gas which may be different from or the same as the first inert gas used in the cleaning gas. A switching valve 64 for controlling the flow rate of the inert gas is installed at a position at which the branch line 54a is connected to the inert gas supply part 62.

Accordingly, when the deposition gases are supplied into the chamber 40 from the first to third deposition gas supply parts 50a, 50b and 50c, the back-flow preventing gas supply part 62 supplies the second inert gas (as the back-flow preventing gas) through the cleaning gas supply line 54. Therefore, the second inert gas is continuously supplied into the chamber through the cleaning gas supply line 54 while the deposition process is being carried out, so that the deposition gas does not flow back toward the cleaning gas supply line 54.

Figure 3:
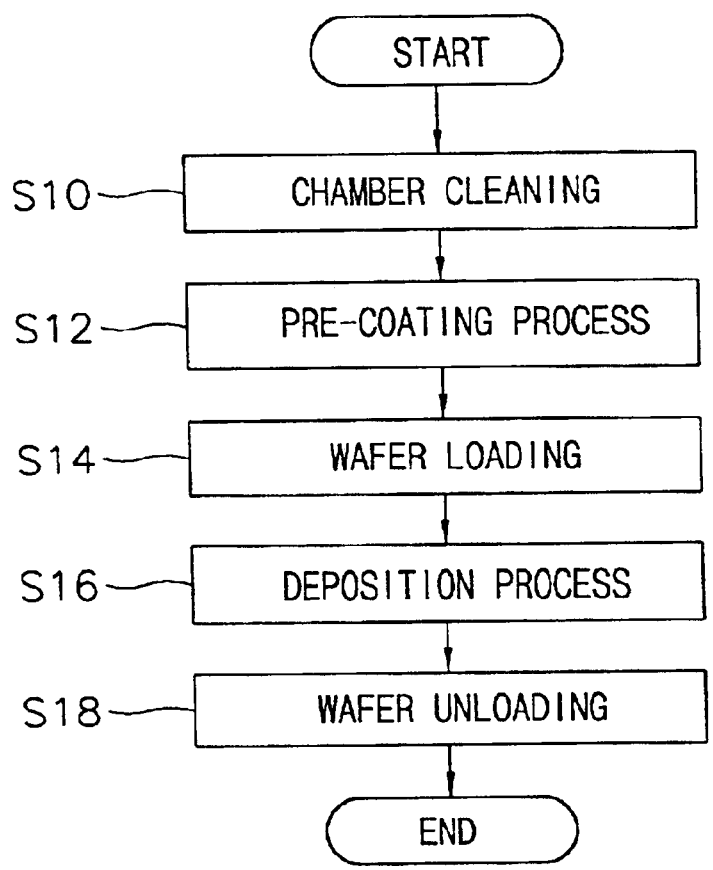
FIG. 3 is a flow chart showing a method for performing a chemical vapor deposition process carried out by the apparatus shown in FIG. 2.

Hereinafter, a method for performing a chemical vapor deposition process by using the apparatus shown in FIG. 2 will be described. FIG. 3 is a flow chart showing a method for performing a chemical vapor deposition process, which forms TEOS (tetraethyl orthosilicate) film on the wafer W. Firstly, the chamber in which the chemical vapor deposition process is carried out is cleaned (step S10). Since the particles which are formed when the former deposition process is carried out remain in the chamber, the gaseous polymer (polymer generated from the deposition gas in the prior deposition process) in the chamber is etched and exhausted by the cleaning process, before the chemical vapor deposition process is carried out. In order to clean the chamber, a fluorine radical capable of etching the gaseous polymer and the first inert gas for forming the process atmosphere in the chamber are introduced into the chamber.

In detail, the cleaning gas supply portion supplies $NF_3$ gas (an active gas which functions to clean chamber 40) and the first inert gas into the plasma device 56. At this time, the plasma device 56 excites the $NF_3$ gas so that the excited $NF_3$ gas, and the first inert gas which is in an un-excited state, are introduced into the chamber 40. An inert gas such as nitrogen, helium, argon, etc. may be used. In this example, argon gas is used as the first inert gas. The particles attached to the sidewalls of the chamber 40 and that float in the chamber are etched (reacted with the excited cleaning gas) and exhausted by the fluorine radical.

In order to introduce the fluorine radical into the chamber 40, about 3000 to 4000 cc of the gases, in which the $NF_3$ gas and the first inert gas are mixed at a ratio of 1 to 1, are supplied into the plasma device 56. Then, the fluorine radical created in the plasma device 56 and the first inert gas are introduced into the chamber 40 so as to clean the chamber 40. When the cleaning process is carried out, the pressure of the chamber 40 is maintained at a higher pressure than when the deposition process is performed. For example, the chamber is maintained at a pressure of 450 to 550 Torr.

When the cleaning process is finished, the cleaning gas supply section 58 stops supply of the cleaning gas. Then, the deposition gas is supplied into the chamber 40 so as to pre-coat sidewalls of the chamber and the upper portion of the heater 42 on which the wafer is loaded (step S12). The pre-coating process is carried out under a same process condition as the deposition process of the wafer, except for the time condition. That is, by the pre-coating process, the chamber atmosphere is properly formed in advance and a pure material having a predetermined thickness is deposited on the sidewalls of the chamber, so as to allow the gas to effectively form a deposited film on the wafer. At this time, a part of the deposition gas introduced into the chamber 40 for the pre-coating process can flow back toward the cleaning gas supply line 54. Accordingly, the second inert gas as the back-flow preventing gas may be simultaneously introduced into the chamber 40 through the cleaning gas supply line 54.

When the pre-coating process is finished, the wafer is loaded on the heater 42 (step S14). Then, the deposition gas is introduced into the chamber 40 from the upper portion of the chamber, so that the film is deposited on the wafer (step S16).

When the TEOS film is deposited on the wafer, a mixed gas of TEOS of 2000–2500 cc and helium gas of 18000–22000 cc, which includes ozone at about 13–16 percent, is introduced into the chamber 40. In addition, the chamber 40 is maintained at a pressure of 170 to 230 Torr. The TEOS film deposition process is performed for several seconds. At this time, the second inert gas is introduced into the chamber 40 through the branch line 54a which is branched from the cleaning gas supply line 54.

In greater detail, the deposition gas (which includes a reactant gas and a carrier gas for carrying the reactant gas) for depositing the TEOS film on the wafer is the mixed gas of TEOS (the reactant gas) of 2000–2500 cc, helium gas (the carrier gas of the reactant gas) of 18000–22000 cc, and ozone gas which contains ozone at about 13–16 percent by weight. The ozone gas may be created by supplying an oxygen gas of 14000 to 16000 cc into an ozone generator. The above gases are supplied from the deposition gas supply parts 50a, 50b and 50c and are mixed in the gas mixing part 46 so as to be introduced into the chamber 40. At this time, the temperature of the chamber 40 is in the range of 500 to 550° C., and the pressure of the chamber 40 is in the range of 170 to 230 Torr. When the deposition gas is introduced into the chamber 40, the second inert gas as the back-flow preventing gas is simultaneously introduced into the chamber 40 through the cleaning gas supply line 54. The second inert gas may be nitrogen, helium or argon gas or a mixture thereof. Since the second inert gas is introduced through the cleaning gas supply line 54, the deposition gas is prevented from flowing back toward the cleaning gas supply line 54.

If the amount of the second inert gas to be supplied is insufficient, the deposition gas can flow back toward the cleaning gas supply line 54. In addition, if the amount of the second inert gas to be supplied exceeds a predetermined level, the second inert gas may interrupt the reaction of the deposition gas, so that the film is abnormally deposited on the wafer. Thus, the amount of the second inert gas to be supplied is varied according to the kinds of the gases and the thickness of the film to be deposited. Generally, the amount of the second inert gas to be supplied into the chamber is in the range of 30–100% by volume with respect to the total amount of the gases introduced into the chamber. In addition, when the deposition process is carried out, instead of providing the carrier gas for the reactant gas, an excess amount of the second inert gas may be provided into the chamber through the cleaning gas supply line 54 so as to function as a carrier gas for the deposition gas.

When the film is deposited on the wafer, the wafer is withdrawn from the chamber (step S18).

Figure 4:
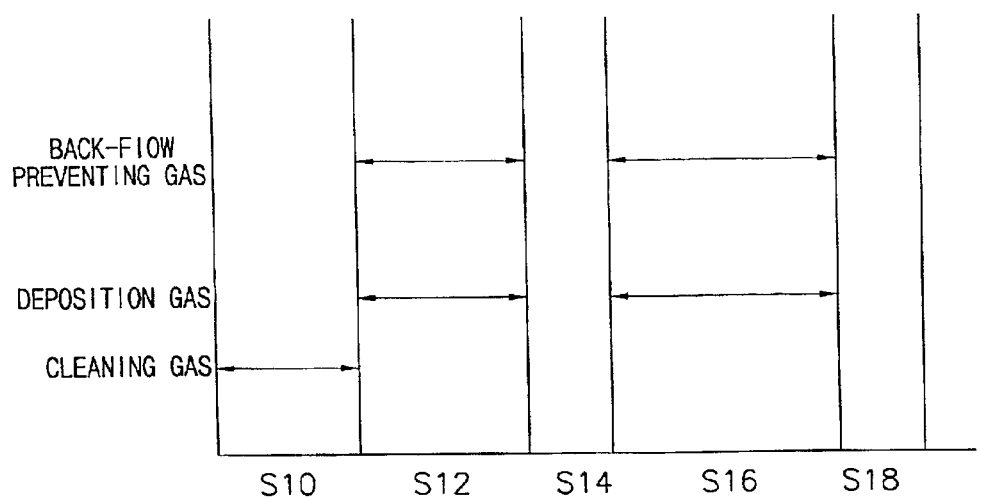
FIG. 4 is a timing chart for explaining the supply of gas in the apparatus shown in FIG. 2.

FIG. 4 is a timing chart for explaining the supply of the cleaning gas, the deposition gas and the back-flow preventing gas. As shown in FIG. 4, the back-flow preventing gas is supplied into the chamber together with the deposition gas during the pre-coating step (step S12) and the deposition step (step S16). The back-flow preventing gas is not supplied during the cleaning step (step S10). In the cleaning step (step S10), the first inert gas which acts as a carrier gas for carrying the active gas, i.e. $NF_3$ gas, is introduced.

The back-flow preventing gas supply part 62 can be separately provided. However, the cleaning gas supply section 58 may also include a back-flow preventing gas supply part which supplies the back-flow preventing gas into the chamber 40 so as to clean the chamber. Accordingly, the back-flow preventing gas can be supplied from the cleaning gas supply section 58 so as to prevent the deposition gas from flowing back toward the cleaning gas supply section 58.

Since the deposition gas does not flow back toward the cleaning gas supply line 54, the cleaning gas supply section 58 is prevented from being contaminated. In addition, since the particles caused by the contamination of the cleaning gas supply line are reduced, the yield rate and reliance of the semiconductor device are improved.

Figure 5:
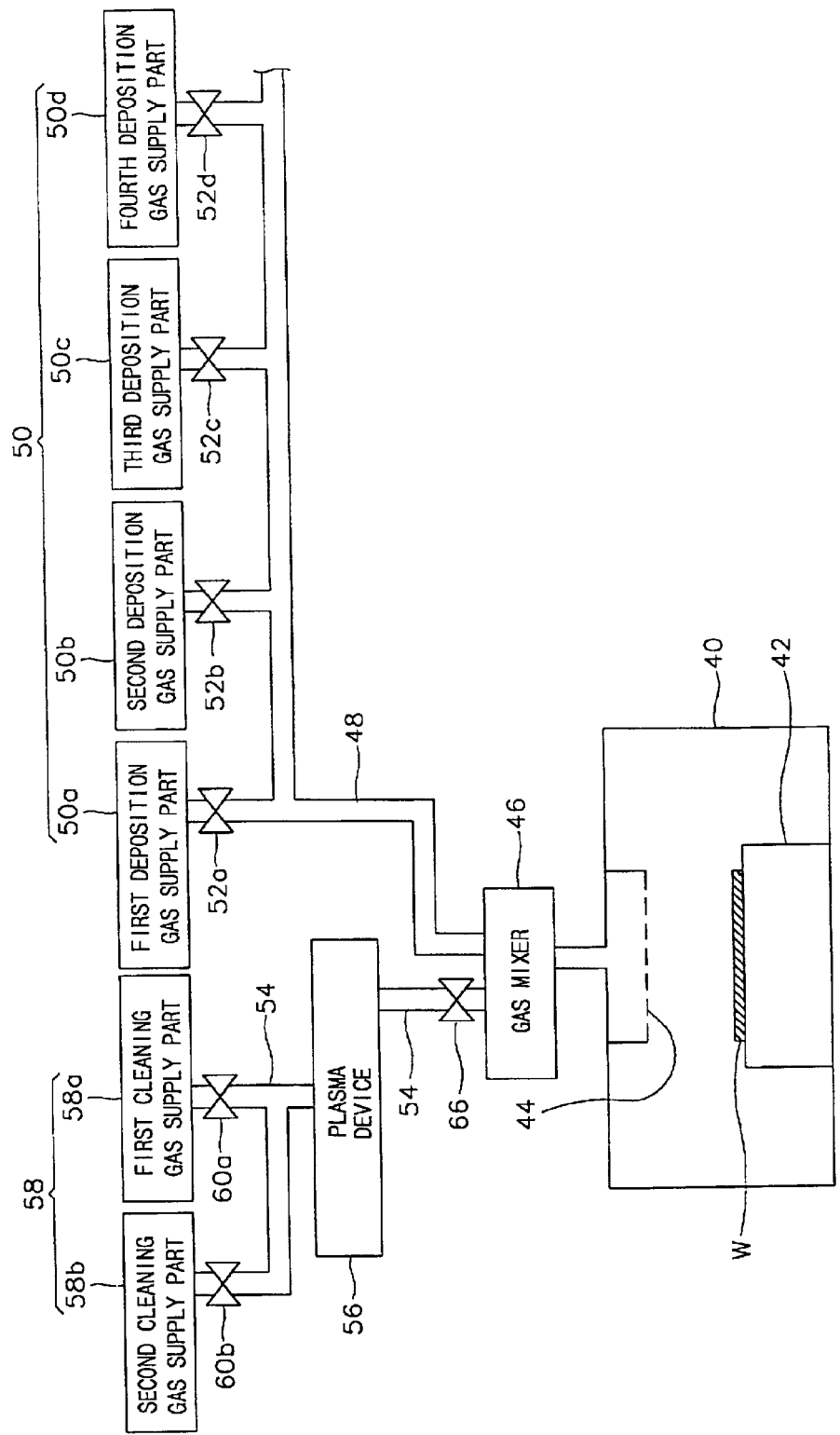
FIG. 5 is a schematic structural view showing an apparatus for performing a chemical vapor deposition process according to a second embodiment of the present invention.

FIG. 5 shows an apparatus for carrying out the chemical vapor deposition process according to a second embodiment of the present invention. In this embodiment, instead of supplying the back-flow preventing gas, a switching valve is provided to prevent the deposition gas from flowing back toward the cleaning gas supply section. The apparatus and method for performing the chemical vapor deposition process in this embodiment are substantially identical to the apparatus and method described in the first embodiment of the present invention. So, elements which are identical to the elements of the first embodiment are designated with the same reference numerals and will not be further described below.

Hereinafter, the apparatus for carrying out the chemical vapor deposition process according to the second embodiment of the present invention will be explained with reference to FIG. 5. In this embodiment, the structure and the function of the chamber 40, the cleaning gas supply section 58, the plasma device 56, the deposition gas supply section 50 and the gas mixer 46 are substantially identical to those of the first embodiment. However, the branch line 54a for preventing the deposition gas from flowing back toward the cleaning gas supply section 58 and the back-flow preventing gas supply part 62 connected to the branch line 54a in FIG. 2 are omitted in this embodiment. When an inert gas supplied from the branch line for forming the process atmosphere in the chamber in the first embodiment is necessary in this embodiment, the inert gas may be supplied from a separate deposition gas supply part.

In this embodiment, a switching valve 66 is provided at a connection point between the cleaning gas supply line 54 and the gas mixer 46, in order to prevent the deposition gas from flowing back toward the cleaning gas supply line 54. The switching valve 66 is opened only when the cleaning process for the chamber 40 is carried out. That is, the switching valve 66 is closed off while the pre-coating process and the deposition process are being carried out.

Figure 6:
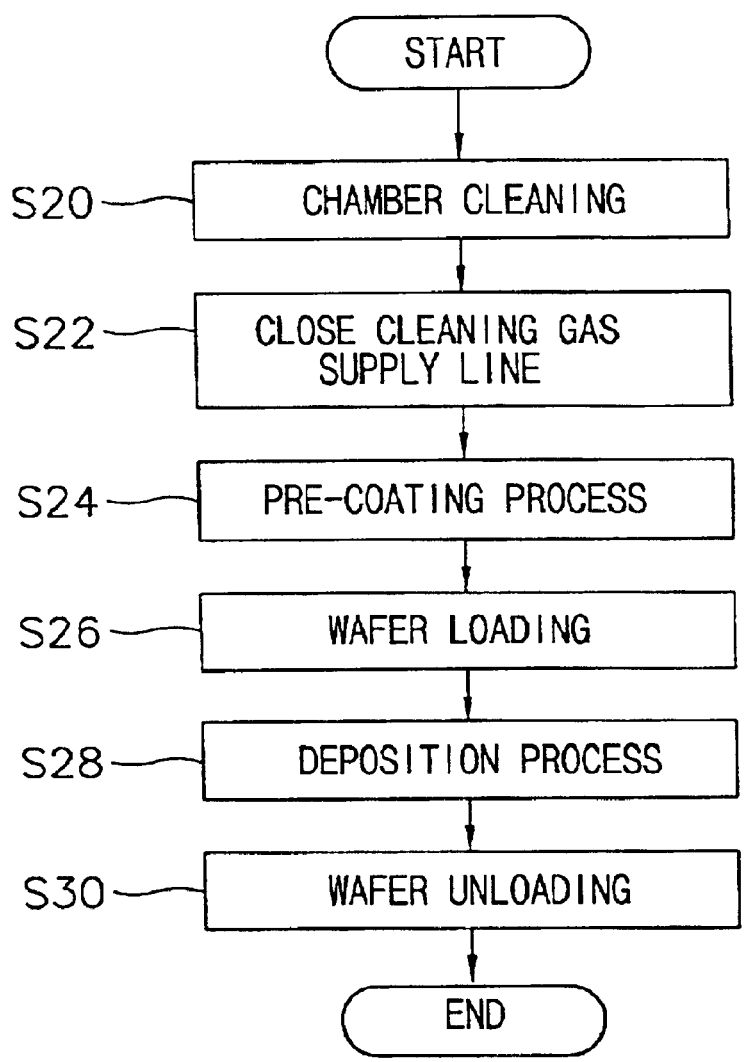
FIG. 6 is a flow chart showing a method for performing a chemical vapor deposition process carried out by the apparatus shown in FIG. 5.

Hereinafter, a method for performing a chemical vapor deposition process by using the apparatus of FIG. 5 is explained with reference to FIG. 6. The method of the present embodiment is similar to the method of the first embodiment.

Firstly, the chamber 40 in which the chemical vapor deposition process is carried out is cleaned (step S20). In order to clean the chamber 40, a fluorine radical capable of etching the gaseous polymer and an inert gas (which functions as a carrier gas for carrying the flourine radical) for forming the process atmosphere in the chamber are introduced into the chamber. The fluorine radical is created by exciting $NF_3$ gas by using the plasma device 56 installed at an exterior of the chamber 40. When the cleaning process is finished, the cleaning gas supply section 58 stops the supply of the cleaning gas. Then, the switching valve 66 disposed between the cleaning gas supply line 54 and the gas mixer is closed off (step S22).

Then, the deposition gas is supplied into the chamber 40 so as to pre-coat the sidewalls of the chamber 40 and the upper portion of the heater 42 on which the wafer is loaded (step S24). The coating process is carried out using the same process conditions as during the deposition process of the wafer, except for the time condition. That is, by the pre-coating process, the chamber atmosphere is properly formed in advance and a pure material having a predetermined thickness is deposited on the sidewalls of the chamber 40, so as to allow the gas to be effectively reacted to form a deposited film on the wafer. At this time, since the switching valve 66 is closed off, the deposition gas cannot flow back toward the cleaning gas supply line 54.

When the pre-coating process is finished, the wafer is loaded on the heater 42 (step S26). Then, the deposition gas is introduced into the chamber 40 from the upper portion of the chamber, so that the film is deposited on the wafer (step S28). Since the switching valve 66 is still closed off while the film is being deposited on the wafer, the deposition gas cannot flow back toward the cleaning gas supply line 54. Accordingly, the particles caused by the deposition gas flowing into the cleaning gas supply line 54 are prevented from forming in the cleaning gas supply line 54. When the deposition process is finished, the wafer is withdrawn (unloaded) from the chamber 40 (step S30).

As described above, according to the present invention, the deposition gas is prevented from flowing back toward the cleaning gas supply line 54 while the film deposition process is being carried out. So, the deposition gas cannot contaminate the cleaning gas supply line 54 and particles are effectively reduced while the film is being deposited on the wafer. Accordingly, the yield and reliability of the semiconductor device are improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of performing a chemical vapor deposition processing comprising:

cleaning a process chamber at a first chamber pressure by producing a cleaning gas into the process chamber through a cleaning gas supply line;

pre-coating a film on inner sidewall of the process chamber at a chamber pressure lower than the first chamber pressure by introducing a deposition gas into the process chamber, wherein during said pre-coating, a back-flow preventing gas is introduced into the process chamber through the cleaning gas supply line to prevent the deposition gas from flowing back toward the cleaning gas supply line;

loading a wafer into the process chamber after said the cleaning; and depositing a film on the wafer at a chamber pressure lower than the first chamber pressure by introducing a deposition gas into the process chamber, wherein during said depositing, a back flow preventing gas is introduced into the process chamber through the cleaning gas supply line to prevent the deposition gas from flowing back toward the cleaning gas supply line.

2. The method as claimed in claim 1, wherein the back-flow preventing gas is at least any one selected from a group consisting of nitrogen, argon and helium.

3. The method as claimed in claim 1, wherein a flow rate of the back-flow preventing gas is at a ratio of 30 to 100% with respect to a flow rate of the deposition gas.

4. The method as claimed in claim 1, wherein the cleaning gas is a gas including a fluorine radical which is generated by exciting NF3 gas at an exterior of the process chamber before said cleaning.

5. The method as claimed in claim 1, wherein the cleaning gas includes an active gas and an inert gas as a carrier gas for carrying the active gas.

6. The method as claimed in claim 5, wherein the inert gas is at least any one selected from a group consisting of nitrogen, argon and helium.

7. The method as claimed in claim 5, wherein the back-flow preventing gas is introduced into the process chamber through the cleaning gas supply line to prevent the deposition gas from flowing back toward the cleaning gas supply line, the carrier gas being the same as the back-flow preventing gas and being supplied from a same source.

8. The method as claimed in claim 5, wherein the back-flow preventing gas is introduced into the process chamber through the cleaning gas supply line to prevent the deposition gas from flowing back toward the cleaning gas supply line, the carrier gas being different from the back-flow preventing gas and being supplied separately from a gas source that is different than a back-flow preventing gas source.

9. The method as claimed in claim 1, wherein the first chamber pressure is 400 to 550 Torr.

10. The method as claimed in claim 9, wherein the second chamber pressure is 170 to 230 Torr.

11. The method as claimed in claim 1, wherein before introducing the deposition gas into the process chamber, the deposition gas is mixed outside of the chamber.

* * * * *